US008063911B2

(12) United States Patent
Ramanath et al.

(10) Patent No.: US 8,063,911 B2

(45) Date of Patent: Nov. 22, 2011

(54) SYSTEM AND METHOD FOR GAMUT MAPPING OF OUT-OF-GAMUT SIGNALS

(75) Inventors: Rajeev Ramanath, Plano, TX (US); Larry Layne Jenkins, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 823 days.

(21) Appl. No.: 11/948,600

(22) Filed: Nov. 30, 2007

(65) Prior Publication Data

US 2009/0141039 A1 Jun. 4, 2009

(51) Int. Cl.

| | |
|---|---|
| ***G09G 5/00*** | (2006.01) |
| ***G09G 5/02*** | (2006.01) |
| ***H04N 5/46*** | (2006.01) |
| ***H04N 5/74*** | (2006.01) |
| ***H04N 1/46*** | (2006.01) |
| ***G02F 1/07*** | (2006.01) |
| ***G06K 9/00*** | (2006.01) |
| *G03F 3/038* | (2006.01) |
| *G03F 3/08* | (2006.01) |
| *G09G 3/16* | (2006.01) |
| *H04N 9/28* | (2006.01) |
| *H04N 5/00* | (2006.01) |
| *G06K 9/36* | (2006.01) |
| *G06K 9/40* | (2006.01) |

(52) U.S. Cl. ........ 345/581; 345/590; 345/690; 345/549; 345/204; 348/557; 348/607; 348/758; 348/807; 358/509; 358/519; 382/166; 382/254; 382/274; 382/167; 359/246; 359/250; 359/389

(58) Field of Classification Search .......... 345/427–428, 345/581, 586, 589–590, 597, 22, 600–606, 345/618, 643, 660, 204, 690, 63, 84, 88, 345/591, 547, 549, 555, 48, 77; 348/101, 348/557, 558, 560, 571, 577, 603–607, 716–717, 348/724, 739, 758–760, 624, 807–808; 358/515–520, 447–448, 509, 523
See application file for complete search history.

(56) References Cited

U.S. PATENT DOCUMENTS

| | | | |
|---|---|---|---|
| 5,243,414 | A | 9/1993 | Dalrymple et al. |
| 5,450,217 | A | 9/1995 | Eschbach et al. |
| 5,731,818 | A | 3/1998 | Wan et al. |
| 6,573,889 | B1 | 6/2003 | Georgiev |
| 6,594,387 | B1 | 7/2003 | Pettitt et al. |
| 6,771,311 | B1 | 8/2004 | Weldy |
| 6,778,185 | B1 | 8/2004 | Moroney |

(Continued)

*Primary Examiner* — Wesner Sajous

(74) *Attorney, Agent, or Firm* — Charles A. Brill; Wade James Brady, III; Frederick J. Telecky, Jr.

(57) ABSTRACT

A system and method for gamut mapping out-of-gamut signals. A method includes adjusting each color in a color signal, determining a maximum color value of the color signal, in response to a determining that the maximum color value exceeds a maximum displayable color value, scaling color values of colors not having the maximum color value, and setting the color value of the color having the maximum color value to be equal to the maximum displayable color value. The method further includes leaving the color values of the colors in the color signal unchanged in response to a determining that the maximum color value does not exceed the maximum displayable color value. The scaling of color values not equal to the maximum color value results in a maintaining of a proper hue of the color signal, thereby not introducing color artifacts and other forms of color noise.

5 Claims, 4 Drawing Sheets

U.S. PATENT DOCUMENTS

| | | | | |
|---|---|---|---|---|
| 7,181,065 | B2 | 2/2007 | Pettitt et al. | |
| 7,262,780 | B2 | 8/2007 | Hu | |
| 2006/0232803 | A1 * | 10/2006 | Hori et al. | 358/1.9 |
| 2007/0046826 | A1 * | 3/2007 | Bellis et al. | 348/656 |
| 2008/0043150 | A1 * | 2/2008 | Bellis et al. | 348/655 |
| 2009/0021809 | A1 * | 1/2009 | Ramanath | 358/520 |
| 2009/0174638 | A1 * | 7/2009 | Elliott et al. | 345/88 |
| 2009/0267529 | A1 * | 10/2009 | Muhlschlegel | 315/246 |

* cited by examiner

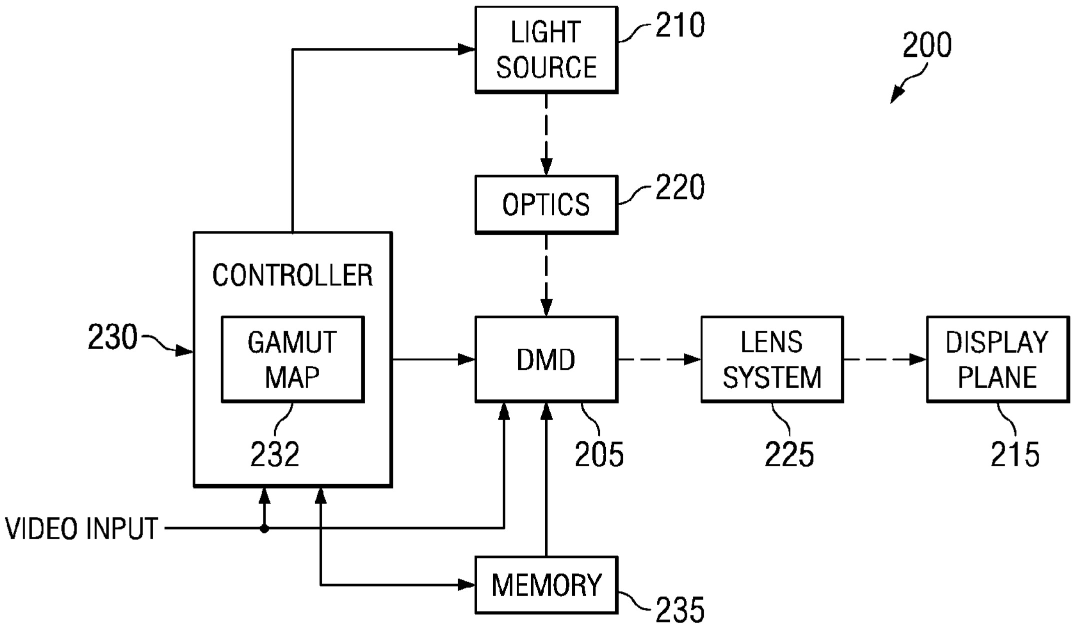
*FIG. 2a*
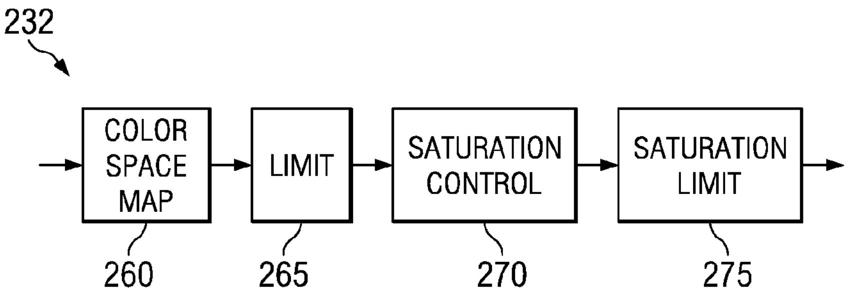
*FIG. 2b*
300
305
| | R | G | B | C | M | Y | W |
|---|---|---|---|---|---|---|---|
| R | 1.4 | 0.05 | 0.01 | 0 | 1 | 1.5 | 1 |
| G | 0.1 | 1.2 | 0 | 1.12 | 0 | 1 | 1 |
| B | 0 | 0.001 | 1.17 | 1 | 1.2 | 0 | 1 |
*FIG. 3*

400 409 414 419 410 415 420

| | | | | | | | | | | | |
|---|---|---|---|---|---|---|---|---|---|---|---|
| R | 0 | 25.5 | 51 | 76.5 | 102 | 127.5 | 153 | 178.5 | 204 | 229.5 | 255 |
| G | 0 | 0 | 0 | 0 | 0 | 0 | 0 | 0 | 0 | 0 | 0 |
| B | 0 | 30.6 | 61.2 | 91.8 | 122.4 | 153 | 183.6 | 214.2 | 244.8 | 275.4 | 306 |

*FIG. 4a* 412 417 422

425

| | | | | | | | | | | | |
|---|---|---|---|---|---|---|---|---|---|---|---|
| R | 0 | 25.5 | 51 | 76.5 | 102 | 127.5 | 153 | 178.5 | 204 | 229.5 | 255 |
| G | 0 | 0 | 0 | 0 | 0 | 0 | 0 | 0 | 0 | 0 | 0 |
| B | 0 | 25.5 | 51 | 76.5 | 102 | 127.5 | 153 | 178.5 | 204 | 229.5 | 255 |

*FIG. 4b*

430 410 415 420

| | | | | | | | | | | | |
|---|---|---|---|---|---|---|---|---|---|---|---|
| R | 0 | 25.5 | 51 | 76.5 | 102 | 127.5 | 153 | 178.5 | 204 | 229.5 | 255 |
| G | 0 | 0 | 0 | 0 | 0 | 0 | 0 | 0 | 0 | 0 | 0 |
| B | 0 | 30.6 | 61.2 | 91.8 | 122.4 | 153 | 183.6 | 214.2 | 244.8 | 255 | 255 |

*FIG. 4c* 412 437 442

460 410 465 470

| | | | | | | | | | | | |
|---|---|---|---|---|---|---|---|---|---|---|---|
| R | 0 | 25.5 | 51 | 76.5 | 102 | 127.5 | 153 | 178.5 | 204 | 212.5 | 212.5 |
| G | 0 | 0 | 0 | 0 | 0 | 0 | 0 | 0 | 0 | 0 | 0 |
| B | 0 | 30.6 | 61.2 | 91.8 | 122.4 | 153 | 183.6 | 214.2 | 244.8 | 255 | 255 |

*FIG. 4d* 412 467 472

SYSTEM AND METHOD FOR GAMUT MAPPING OF OUT-OF-GAMUT SIGNALS

TECHNICAL FIELD

The present invention relates generally to a system and method for displaying images, and more particularly to a system and method for gamut mapping out-of-gamut signals.

BACKGROUND

When displaying an image for viewing purposes, it may be desirable to utilize as large a color gamut as possible. In general, the use of a large color gamut allows for a more accurate rendering of the image since a larger number of colors may be available for use in displaying the image. However, a display system may have a fixed color gamut dependent on an illumination system used in the display system. For example, display systems using laser light sources, light emitting diodes, electric arc lamps, and so forth, may have fixed color gamuts based on the illumination system. The attempted display of an image using a color gamut that may be larger than the color gamut of the display system may result in the display system attempting to display colors with negative color values. For example, in a YCbCr color space, some non-negative RGB YCbCr values may correspond to negative RGB values in an alternative RGB color space. Thus, in display systems not capable of displaying colors with negative RGB color values, an inaccurate rendering of the color and image may be the result. This may potentially result in the image having a worse appearance than if a smaller color gamut was initially used to display the image.

Another technique commonly used to increase image quality of images displayed by a display system is to boost color saturation. Boosting color saturation may entail the gaining of one or more color components of a signal in an image being displayed by the display system. Boosting color saturation may increase the image quality by increasing the colorfulness of the image. However, like negative color values, the use of color saturation boosting may result in color values exceeding color values displayable by a display system, and may result in color value clipping and the introduction of color artifacts and noise, which may negatively impact image quality.

SUMMARY OF THE INVENTION

These and other problems are generally solved or circumvented, and technical advantages are generally achieved, by embodiments of a system and a method for gamut mapping out-of-gamut signals.

In accordance with an embodiment, a method for boosting a color saturation of a color signal comprises adjusting a color value associated with each color in the color signal, determining a maximum color value of the color signal. In response to a determining that the maximum color value exceeds a maximum displayable color value, the method comprises scaling color values of colors not having the maximum color value, and setting the color value of the color having the maximum color value to be equal to the maximum displayable color value. Otherwise the method leaves the color values of the colors in the color signal unchanged in response to a determining that the maximum color value does not exceed the maximum displayable color value.

In accordance with another embodiment, a method for gamut mapping a color signal comprises mapping the color signal from a first color space to a second color space, boosting a color saturation of the mapped color signal, and saturation limiting the boosted color signal.

In accordance with another embodiment, a system comprises a light source, an array of light modulators optically coupled to the light source and positioned in a light path of the light source, the array of light modulators configured to produce images on a display plane by modulating light from the light source based on image data, a video input providing a color signal, and a controller electronically coupled to the array of light modulators and to the light source, the controller configured to load image data into the array of light modulators and to provide commands to the light source, the controller comprising a gamut mapping unit, the gamut mapping unit configured to map the color signal from a first color space into a second color space, and to scale color values of the color signal to prevent color values from exceeding a maximum displayable color value.

An advantage of an embodiment is that the boosting of color saturation to increase image colorfulness does not introduce color artifacts that may negatively impact image quality. This may enable saturation gains for black to color ramps as well as providing a measure of noise immunity.

A further advantage of an embodiment is that signals with negative color values may be displayed in a display system that is not normally capable of displaying signals with negative color values.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2*a* is a diagram of a DMD-based projection display system;

FIG. 2*b* is a diagram of a gamut map unit;

FIG. 3 is a diagram of a table of color value boost values;

FIG. 4*a* is a diagram of a table of color value boosted color signals;

FIG. 4*b* is a diagram of a table of color values prior to color boosting;

FIG. 4*c* is a diagram of a table of hard clipped color value boosted color signals;

FIG. 4*d* is a diagram of a table of scaled color value boosted color signals;

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a digital micromirror device (DMD) based projection display system. The invention may also be applied, however, to other display systems, both projection and direct view, including microdisplay-based projection display systems, such as those utilizing transmissive or reflective liquid crystal displays, liquid crystal on silicon, ferroelectric liquid-crystal-on-silicon, deformable micromirrors, and so forth, and cathode ray tube projection and direct view display systems, such as liquid crystal displays, plasma displays, surface-conduction electron-emitter displays (SED), and so forth. Additionally, the invention may be applied to systems that make use of color space other than display systems, such as image capture and image editing systems.

Figure 1A:
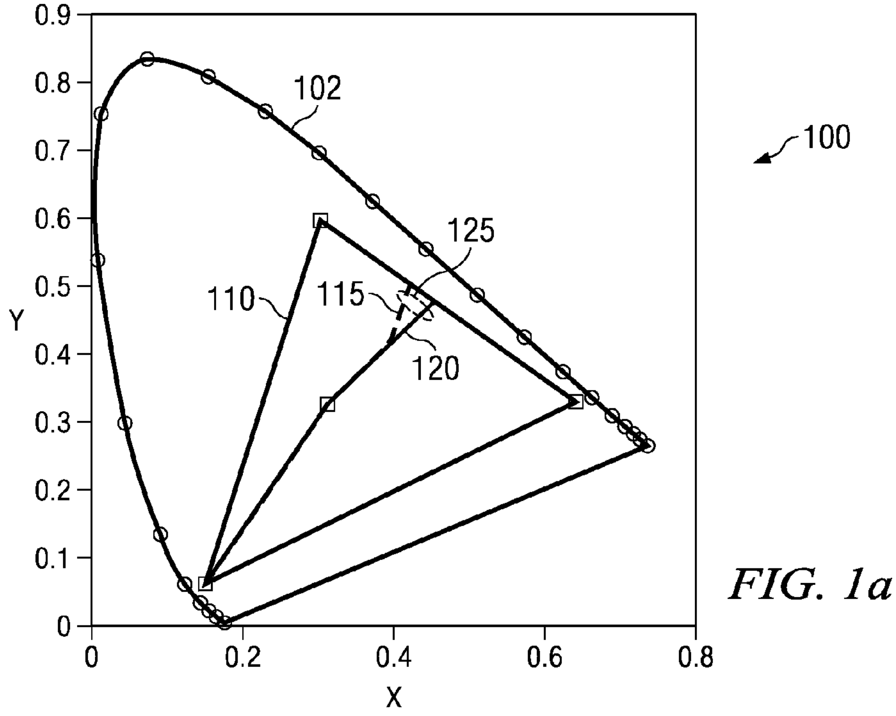
FIGS. 1*a* and 1*b* are diagrams of CIE xy chromaticity diagrams.

With reference now to FIG. 1*a*, there is shown a diagram illustrating an exemplary International Commission on Illumination (CIE) xy chromaticity diagram 100. The CIE xy chromaticity diagram 100 illustrates a visible spectrum 102. Inside the visible spectrum 102 is a color gamut of a red, green, and blue (RGB) color space, shown as triangle 110. Shown within the color gamut 110 is a first trace 115 illustrating color saturation boosting in a blue to yellow color ramp. The first trace 115 illustrates a hue shift occurring as the color values approach a maximum displayable color value for the color yellow due to a hard clipping of color values. A second trace 120 illustrates color saturation boosting in a blue to yellow color ramp. The second trace 120 illustrates a lack of hue shift due to a scaling of color values that takes into consideration color saturation boosting occurring in the other colors of the color gamut 110. A difference between the first trace 115 and the second trace 120 is shown as highlight 125 and may be significant for large values of the color yellow.

Figure 1B:
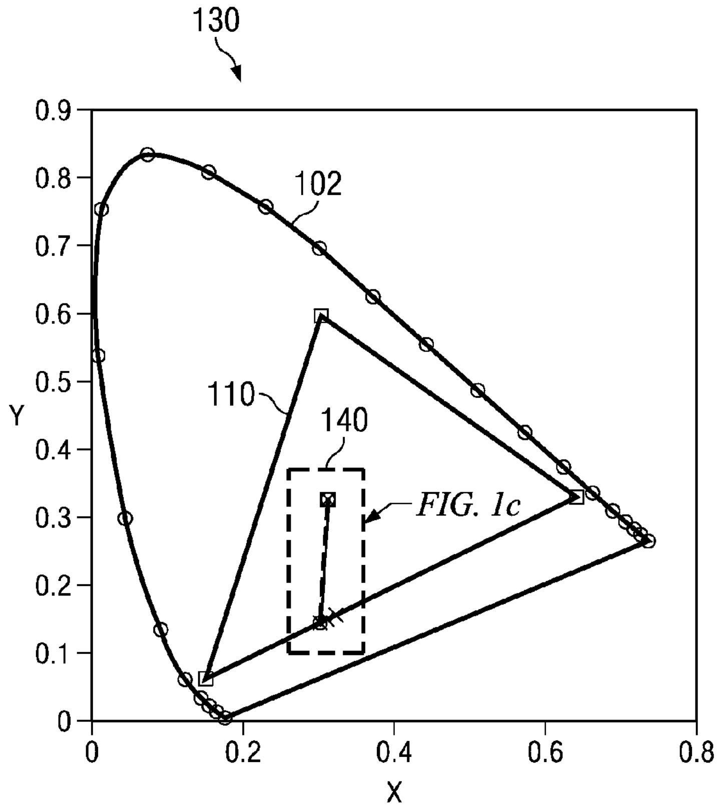
Figure 1C:
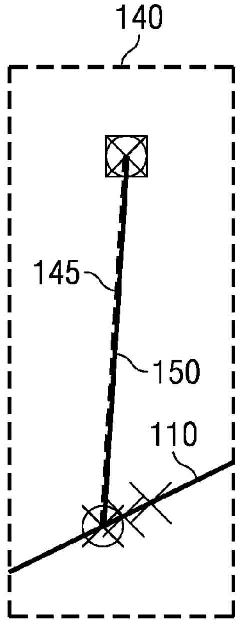
FIG. 1*c* is an enlarged view of a portion of the CIE xy chromaticity diagram of FIG. 1*b*.

FIG. 1*b* illustrates an exemplary CIE xy chromaticity diagram 130. Inside the visible spectrum 102 is a color gamut 110 of an RGB color space. Shown within the color gamut 110 highlighted in a dashed rectangular box 140 is a third trace 145 (heavy dashed line) and a fourth trace 150 (thin solid line) illustrating black to magenta ramps. The third trace 145 displays a hue shift occurring as the color values approach a maximum displayable color value for the color magenta due to a hard clipping of color values that have been color saturation boosted. The fourth trace 150 illustrates a lack of hue shift due to a scaling of color values that takes into consideration color saturation boosting occurring in the other colors of the color gamut 110.

FIG. 2*a* illustrates an exemplary DMD-based projection display system 200. The DMD-based projection display system 200 includes a DMD 205 that modulates light produced by a light source 210. The DMD 205 is an example of a microdisplay or an array of light modulators. Other examples of microdisplays may include transmissive or reflective liquid crystal, liquid crystal on silicon, ferroelectric liquid-crystal-on-silicon, deformable micromirrors, and so forth. In a microdisplay, a number of light modulators may be arranged in a rectangular, square, diamond shaped, and so forth, array. Each light modulator in the microdisplay may operate in conjunction with the other light modulators in the microdisplay to modulate the light produced by the light source 210. For example, in the DMD 205, each light modulator is a pivoting mirror that generally pivots between one of two positions depending on image data being displayed. In a first position, the light modulator reflects light from the light source onto a display plane 215 and in a second position, the light modulator reflects light away from the display plane 215. The light modulated by the DMD 205 may be used to create images on the display plane 215. The DMD-based projection display system 200 also includes an optics system 220, which may be used to collimate the light produced by the light source 210 as well as to collect stray light, and a lens system 225, which may be used to manipulate (for example, focus) the light reflecting off the DMD 205.

The DMD 205 may be coupled to a controller 230, which may be responsible for loading image data into the DMD 205, controlling the operation of the DMD 205, providing micromirror control commands to the DMD 205, controlling the light produced by the light source 210, and so forth. A memory 235, which may be coupled to the DMD 205 and the controller 230, may be used to store the image data, as well as configuration data, color correction data, and so forth.

The controller 230 may include a gamut map unit 232. The gamut map unit 232 may be used to map a color signal from a color space that may support negative RGB color values into an RGB color space that only has non-negative RGB color values. The gamut map unit 232 may also apply color saturation boosting to improve image quality by making an image more color full. Additionally, the gamut map unit 232 may also perform color value scaling to prevent the introduction of color artifacts and noise that may be introduced if hard clipping is used to limit color values that exceed a maximum displayable color value.

Although the discussion has focused on three-color color spaces (RGB) to represent image color information of an image, the DMD-based projection display system 200 may utilize a wide range of colors in displaying images, with the number of colors used to display the image being different from the number of colors used to represent the color information. For example, the DMD-based projection display system 200 may use two colors, three colors, four colors, five colors, six colors, seven colors, and so forth, to actually display images. A three-color color space may be sufficient to fully represent color information of an image. However, to display the image, three or more colors may be needed to achieve a desired image quality. Therefore, the discussion of three-color color spaces to represent image color information should not be construed as being limiting to either the scope or the spirit of the embodiments.

FIG. 2*b* illustrates a detailed view of the gamut map unit 232. The gamut map unit 232 includes a color space map unit 260. The color space map unit 260 may be used to map a color space that may have RGB color values that may translate into negative RGB color values in a color space used in the DMD-based projection display system 200. The color space map unit 260 may basically perform a transform to fit a larger input color space into a smaller output color space. For example, the color space map unit 260 may take as input a signal in the Rec. 709 color space and map the signal into the color space used in the DMD-based projection display system 200, such as a laser-based color space. Rec. 709 is a color space used in film and video production. Other color spaces include standardized color spaces, such as the sYCC or the xvYCC color space, that allow for negative RGB values to be encoded in the YCbCr color space.

The mapping performed by the color space map unit 260 may be expressed mathematically as a 3 by 3 color conversion matrix, $$\begin{bmatrix} a_{00} & a_{01} & a_{02} \\ a_{10} & a_{11} & a_{12} \\ a_{20} & a_{21} & a_{22} \end{bmatrix},$$

where the terms $a_{00}, \ldots, a_{22}$, may be dependent upon the input color space (for example, Rec. 709) and the output color space (for example, a laser-based color space for a display system using laser illumination). When expressed in terms of the output color space, a possible range of color values of a signal in the input color space may be from $-x \leqq RGB \leqq 2^N-1$, where x is an integer value and N is the bit-depth of a display system. For example, in a display system with N=8, then 255 ($2^8-1$) may be a maximum displayable color value. However, depending on bit-depth of the DMD-based projection display system 200, the maximum displayable color value may be a value other than 255. Therefore, the discussion of 255 being the maximum displayable color value should not be construed as being limiting to either the scope or the spirit of the embodiments.

For discussion purposes, consider, for example, a case of a display system with a master color space with RGB color primaries defined by CIE xy chromaticity coordinates of (0.7, 0.3) for red, (0.15, 0.8) for green, (0.14, 0.03) for blue and a white point given by (0.313, 0.329). Consider also a color space defined by an encoding set of primaries with coordinates of (0.64, 0.33) for red, (0.3, 0.6) for green, (0.15, 0.06) for blue and a white point given by (0.313, 0.329). In this case, the color conversion matrix to covert data from the master color space to the color space defined by encoding primaries may be given by:

$$\begin{bmatrix} 0.624006 & 0.353519 & 0.0224746 \\ 0.058144 & 0.895667 & 0.0461895 \\ 0.016174 & 0.077232 & 0.9065936 \end{bmatrix}.$$

Those of ordinary skill in the art will recognize that such matrix transforms may be computed using matrix algebra defined around the formation of colors in the two color spaces, the master color space and the color space defined by the encoding set of primaries.

After mapping by the color space map unit 260, the output signal may have a range of color values that should range from $0 \leqq RGB \leqq 2^N-1$. However, the color conversion matrix $$\begin{bmatrix} a_{00} & a_{01} & a_{02} \\ a_{10} & a_{11} & a_{12} \\ a_{20} & a_{21} & a_{22} \end{bmatrix},$$

if improperly chosen, may cause in an improper mapping of the color values in the input signal. The resulting output signal may have color values that exceed the maximum displayable color value, for example, 255. A limit unit 265 may be used to limit (clip) the color value. For example, if a maximum color value in the output signal exceeds 255, then the limit unit 265 may simply fix the maximum color value at 255. Alternatively, the limit unit 265 may perform a scaling of the color values in the output signal so that color information is not lost. For instance, each color value in the signal may be scaled by a factor substantially equal to (255/maximum color value). This scaling may set the maximum color value at 255 and correspondingly reduces other color values in the signal. The scaling may prevent the introduction of color artifacts.

The gamut map unit 232 also includes a saturation control unit 270. The saturation control unit 270 may be used to boost color saturation to improve an image's quality by making the image more colorful. The saturation control unit 270 may make use of a lookup table to determine amounts to boost a signal's color values. Turning now to FIG. 3, there is shown a lookup table 300 containing color value boost values. For example, if a signal contains a magenta color (M), then the color values for the signal may be boosted by factors of one (for the color red), zero (for the color green), and 1.2 (for the color blue). The color value boost values may be computed a priori and stored in a memory. The color value boost values for the color magenta are shown in column 305. Refer to co-assigned U.S. Pat. No. 6,594,387, entitled "Enhanced Color Correction," issued Jul. 15, 2003 and U.S. Pat. No. 7,181,065, entitled "Enhanced Color Correction Circuitry Capable of Employing Negative RGB Values," issued Feb. 20, 2007 for detailed discussions of color saturation boosting, which patents are hereby incorporated herein by reference.

The gamut map unit 232 also includes a saturation limit unit 275. The boosting of a signal's color saturation may result in a more colorful image. However, for signals with higher color values, the boosting of the color saturation may result in color values exceeding the display system's maximum displayable color value. Hard limiting the color values to the maximum displayable color value may introduce color artifacts, hue shifts, and so forth. The saturation limit unit 275 may perform a scaling of a signal that has had its color saturation boosted rather than hard limiting to help prevent the introduction of color artifacts and other forms of color noise. The saturation limit unit 275 may scale all colors of the signal based on the color having the maximum color value. The scaling may be performed so that the color having the maximum color value is scaled so that the maximum color value is set to the maximum displayable color value and other colors in the signal may be scaled to retain proper proportions with the color having the maximum color value. According to a preferred embodiment, the scaling may be performed on signals that have at least one color with a color value exceeding the display system's maximum displayable color value. A detailed description of the scaling of the colors in the signal is provided below.

FIG. 4*a* illustrates a table 400 of the color magenta with a variety color values after receiving color saturation boosting. The table 400 displays the color values after color saturation boosting without any hard clipping or scaling. For discussion purposes, let the maximum displayable color value be equal to 255. In general, a pure color magenta may comprise equal parts of the color red and the color blue. However, color saturation boosting may gain the colors differently. Referring back to FIG. 3, a column 305 illustrates gain values for use in an exemplary color saturation boosting for the color magenta. The gain values show that color saturation boosting may gain the color red by a factor of one, no gain may be applied to the color green, and the color blue may be gained by a factor of 1.2. After color saturation boosting, column 409 displays the color values for the color magenta having original color values of (204 (red), 0 (green), 204 (blue)), which after color saturation boosting becomes (204, 0, 244.8). Similarly, column 414 for the color magenta having original color values of (229.5, 0, 229.5) and column 419 for the color magenta having original color values of (255, 0, 255), becomes after color saturation boosting (229.5, 0, 275.4) and (255, 0, 306). FIG.

4*b* illustrates a table 425 of the color magenta with a variety of color values prior to receiving color saturation boosting.

The color values of the color magenta after color saturation boosting: entry 410 (color value 204), entry 415 (color value 229.5), and entry 420 (color value 255), are equal to or less than the maximum displayable color value (in this example, 255) and may not need hard clipping or scaling. However, two of the blue color values of the color magenta after color saturation boosting: entry 417 (color value 275.4) and entry 422 (color value 306) exceed the maximum displayable color value and may need hard clipping or scaling. Entry 412 (color value 244.8) does not exceed the maximum displayable color value and may not need hard clipping or scaling.

FIG. 4*c* illustrates a table 430 of the color magenta with a variety of color values after receiving color saturation boosting and hard clipping. As described previously, hard clipping simply limits a color value exceeding the maximum displayable color value to the maximum displayable color value. Therefore, entry 417 originally having a color value of 275.4 may be clipped to color value 255 (entry 437). Similarly, entry 422 originally having a color value of 306 may be clipped to color value 255 (entry 442). Color values less than the maximum displayable color value may remain unchanged.

FIG. 4*d* illustrates a table 460 of the color magenta with a variety of color values after receiving color saturation boosting and scaling. Scaling changes all of a signal's colors in a proportional manner to maintain a proper amount of each color in the signal. Entry 417 originally having a color value of 275.4 may be scaled to color value 255 (entry 467). Additionally, entry 415 originally having a color value of 229.5 may be scaled to color value 212.5 (entry 465), wherein the color value 212.5 is equal to 229.5*255/275.4. Similarly, entry 422 originally having a color value of 306 may be scaled to color value 255 (entry 472) and entry 420 originally having a color value of 255 may be scaled to color value 212.5 (entry 470), wherein the color value 212.5 is equal to 255*255/306.

Figure 5:
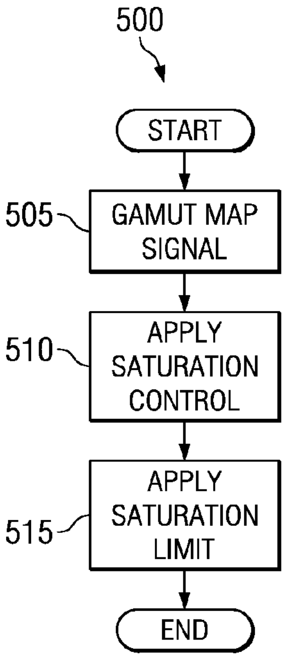
FIG. 5 is a diagram of a sequence of events in gamut mapping a color signal.

FIG. 5 illustrates a sequence of events 500 for use in gamut mapping a color signal. The sequence of events 500 may be used to gamut map a color signal that is in a first color space into a second color space, wherein a color signal in the first color space may be represented with negative color values in the second color space. Additionally, the sequence of events 500 may be used to ensure that color saturation boosting of a color signal does not result in an introduction of color artifacts that may negatively impact the quality of an image being displayed using the color signal. The sequence of events 500 may be used for each color signal in a sequence of color signals.

Figure 6A:
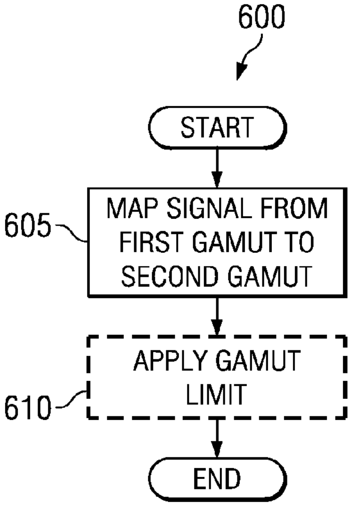
FIG. 6*a* is a diagram of a sequence of events in gamut mapping a color signal from a first color space into a second color space.

The sequence of events 500 may begin with a gamut mapping of a color signal from a first color space (such as, Rec. 709) to a second color space (such as, a laser-based color space) (block 505). Turning now to FIG. 6*a*, there is shown a diagram illustrating a sequence of events 600 for use in gamut mapping a color signal from a first color space to a second color space. The sequence of events 600 illustrates an embodiment of the gamut mapping of a color signal. Other alternatives may be possible and the sequence of events 600 should not be construed as being limiting to either the scope or the spirit of the embodiments. The gamut mapping of the color signal from a first color space to a second color space may make use of a matrix, such as matrix $$\begin{bmatrix} a_{00} & a_{01} & a_{02} \\ a_{10} & a_{11} & a_{12} \\ a_{20} & a_{21} & a_{22} \end{bmatrix},$$

which may be used to map a three-color RGB color space to a three-color RGB color space (block 605).

The gamut mapping may result in a color signal having a color value that exceeds a maximum displayable color value. To prevent this from occurring, the matrix $$\begin{bmatrix} a_{00} & a_{01} & a_{02} \\ a_{10} & a_{11} & a_{12} \\ a_{20} & a_{21} & a_{22} \end{bmatrix}$$

may be revised or an optional signal limiting may be used to ensure that color values in the color signal lie within a range of displayable color values (block 610). The signal limiting, for example, may ensure that color values in the color signal are within a range between zero (0) and a maximum displayable color value. The signal limiting may be a simple clipping operation or a scaling of every color value in the color signal may be used.

Figure 6B:
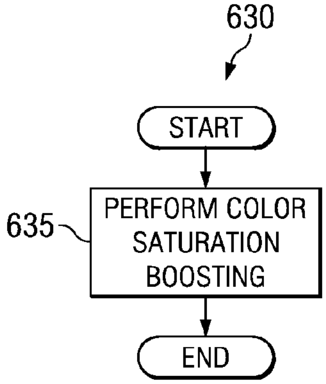
FIG. 6*b* is a diagram of a sequence of events in color value boosting a color signal.

Turning back to FIG. 5, after gamut mapping (block 505), the color signal may undergo color saturation boosting (block 510). Color saturation boosting may improve image quality by making an image more colorful. Turning now to FIG. 6*b*, there is shown a diagram illustrating a sequence of events 630 for use in color saturation boosting. The sequence of events 630 illustrates an embodiment of the boosting of the color saturation of a color signal. Other alternatives may be possible and the sequence of events 630 should not be construed as being limiting to either the scope or the spirit of the embodiments. Color saturation boosting may involve the increasing of color values of one or more colors in the color signal (block 635). Color saturation boosting may make use of a lookup table, such as the lookup table 300 shown in FIG. 3. However, color saturation boosting may push a color's color value to a value above a maximum displayable color value.

Turning back now to FIG. 5, to compensate, saturation limiting may be applied to the color signal (block 515). Saturation limiting scales a color value that exceeds the maximum displayable color value back down to about the maximum displayable color value. In addition, the saturation limiting also scales the color value of other colors in the color signal to maintain a proper proportion of colors in the color signal. This may help to prevent the introduction of color artifacts and other forms of color noise in the color signal.

Figure 6C:
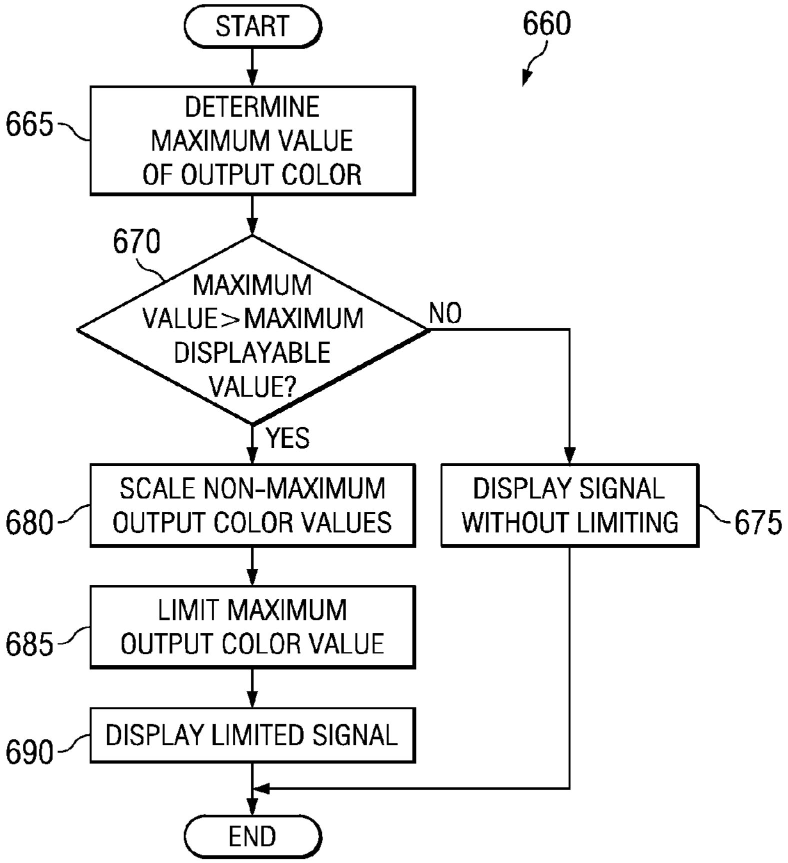
FIG. 6*c* is a diagram of a sequence of events in saturation limiting a color signal.

FIG. 6*c* illustrates a sequence of events 660 for use in saturation limiting a color signal. The sequence of events 660 illustrates an embodiment of the saturation limiting of a color signal. Other alternatives may be possible and the sequence of events 660 should not be construed as being limiting to either the scope or the spirit of the embodiments. The saturation limiting of the color signal may begin with a determination of a maximum color value in the color signal (block 665). A simple series of comparisons of the color value of each color in the color signal may determine the maximum color value. It may be possible that there are more than one maximum color values, e.g., there are at least two colors with color values that are about equal.

Then, a check may be made to determine if the maximum color value is greater than a maximum displayable color value (block 670). If the maximum color value does not exceed the maximum displayable color value, then there is no need to scale the color signal and the color signal may be subsequently displayed without scaling (block 675). However, if the maximum color value does exceed the maximum displayable color value, then scaling of the color signal may be necessary to prevent the introduction of color artifacts. The color values of the colors of the color signal that are not the maximum color value may be scaled by a factor that is proportional to a ratio of the maximum color value and the maximum displayable color value (e.g., scaling factor=(maximum color value)/(maximum displayable color value)) (block 680). The color(s) with the color value(s) exceeding the maximum displayable color value may then be set to be equal to the maximum displayable color value (block 685). Once scaled, the color signal may be subsequently displayed (block 690). The order shown in the sequence of events 600, 630, and 660 may be varied depending on specific implementation.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A display system comprising:

a light source;

an array of light modulators optically coupled to the light source and positioned in a light path of the light source, the array of light modulators configured to produce images on a display plane by modulating light from the light source based on image data;

a video input providing a color signal; and a controller electronically coupled to the array of light modulators and to the light source, the controller configured to load image data into the array of light modulators and to provide commands to the light source, the controller comprising a gamut mapping unit comprising:

a color space map unit coupled to the video input, the color space map unit configured to map the color signal from a first color space to a second color space;

a saturation control unit coupled to the color space map unit, the saturation control unit configured to increase color values of colors in the color signal to increase an image's colorfulness; and a saturation limit unit coupled to the saturation control unit, the saturation limit unit configured to scale color values in the color signal if one of the color values exceeds a maximum displayable color value.

2. The display system of claim 1, further comprising a limit unit coupled between the color space map unit and the saturation control unit, the limit unit configured to clip color values in the color signal exceeding the maximum displayable color value.

3. The display system of claim 2, wherein the limit unit leaves color values not exceeding the maximum displayable color value unchanged.

4. The display system of claim 1, wherein the saturation limit unit is further configured to scale all color values in the color signal if one of the color values exceeds a maximum displayable color value.

5. The display system of claim 1, wherein the array of light modulators comprises a digital micromirror device (DMD).

* * * * *